US006981203B2

(12) United States Patent
Mills

(10) Patent No.: US 6,981,203 B2
(45) Date of Patent: Dec. 27, 2005

(54) METHOD AND APPARATUS FOR RANDOM SHUFFLED TURBO MULTIUSER DETECTOR

(75) Inventor: Diane G. Mills, Wilmington, MA (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 387 days.

(21) Appl. No.: 10/134,330

(22) Filed: Apr. 29, 2002

(65) Prior Publication Data

US 2003/0204808 A1  Oct. 30, 2003

(51) Int. Cl.[7] ............................................. H03M 13/03
(52) U.S. Cl. ...................................... 714/794; 714/795
(58) Field of Search ................................. 714/794, 755

(56) References Cited

U.S. PATENT DOCUMENTS

| | | | |
|---|---|---|---|
| 5,790,606 A | | 8/1998 | Dent |
| 5,982,813 A | | 11/1999 | Dutta et al. |
| 6,023,783 A | * | 2/2000 | Divsalar et al. ............ 714/792 |
| 6,122,269 A | | 9/2000 | Wales |
| 6,198,775 B1 | | 3/2001 | Khayrallah et al. |
| 6,219,341 B1 | | 4/2001 | Varanasi |
| 6,392,572 B1 | * | 5/2002 | Shiu et al. ..................... 341/81 |
| 6,611,513 B1 | * | 8/2003 | ten Brink ...................... 370/342 |
| 2002/0184173 A1 | | 12/2002 | Olivier |

OTHER PUBLICATIONS

PCT International Search Report dated Apr. 14, 2004 of International Application No. PCT/US03/32338 filed Oct. 9, 2003.
"Asymptotic Iterative Multi-user Detection of Random CDMA", by Shi, et al.; ISIT 2002, Lausanne, Switzerland, Jun. 30-Jul. 5, 2002.

* cited by examiner

*Primary Examiner*—Joseph Torres
(74) *Attorney, Agent, or Firm*—Joseph E. Funk

(57) ABSTRACT

A multi-user turbo decoder combining multi-user detection and forward error correction decoding is disclosed in which randomly ordered indices are assigned to interfering users before a decoding tree is constructed in the multi-user decoder for each symbol interval for every iteration and for each new block of data. By building the decoding tree in this manner for each symbol interval, a reduced complexity search is more likely to include paths (and nodes) in the tree containing the correct value for the channel symbols. All users thus share in the benefit of root level placement in the decoding tree. In an alternative embodiment of the invention only one decoding pass is accomplished and there is no re-construction of the decoding tree based on further random index ordering for iterative decoding. No modification to the transmitted signaling method is needed.

18 Claims, 4 Drawing Sheets

$$\Omega(b) = \text{Re}(b_1[2y_1 - b_1 R_{11}]) + \text{Re}(b_2[2y_2 - b_2 R_{22} - 2b_1 R_{12}]) + \text{Re}(b_3[2y_3 - b_3 R_{33} - 2(b_1 R_{13} + b_2 R_{23})]) + \ldots$$

- 1st TERM METRICS FOR A RANDOMLY SELECTED USER
- 2nd TERM METRICS FOR A 2nd RANDOMLY SELECTED USER
- 3rd TERM METRICS FOR A 3rd RANDOMLY SELECTED USER

FIG. 4

METHOD AND APPARATUS FOR RANDOM SHUFFLED TURBO MULTIUSER DETECTOR

FIELD OF THE INVENTION

This invention relates to the field of communications and more particularly to an improved method and apparatus in a receiver for multi-user detection utilizing tree pruning.

BACKGROUND OF THE INVENTION

The present invention belongs to the art of multiple access communications systems such as, but not limited to, wireless Local Area Networks (Wireless LANS), cellular land-mobile communications systems, mobile satellite communications systems, and memory storage and retrieval devices. Such systems are characterized by at least one fixed base or relay station attempting to maintain communications with a plurality of subscriber stations or terminals that are each assigned a different time slot (TDMA), a different frequency slot (FDMA), or different signature waveform (CDMA), to name a few examples.

In such systems, capacity to support a large number of subscribers is measured in units such as Erlangs per MHz per square kilometer, sum capacity (e.g. the sum of the information data rates—Bits/sec—of all the users in the system). Of primary interest is the maximum number of users that can operate within the system without having to decrease the information rate that they are already accustomed to using or increase the total bandwidth occupied by the system. The capacity can be increased by using more MHz of bandwidth, by reducing the area covered by each base station so that there are more base stations per square kilometer, by decreasing the frequency spacing between channels, and by transmitting more than one signal in the same frequency channel or time slot. However, reducing cell size or reducing the number of signals received by the detector is not always possible or economically feasible. When such action is possible, it increases the infrastructure cost. In addition, some of the above listed solutions increase inter-symbol interference (ISI) and multi-user interference (MUI), also called co-channel interference, that may be caused by a signal being received along with a delayed version thereof caused by a reflection of the signal from an object such as a large building, or receipt of another, weaker signal having the same frequency and meant to be received at a different receiver. In addition, received signals are typically corrupted by additive Gaussian noise.

In order to be able to further accommodate increased traffic, and to make maximum utilization of a traffic channel, multiple interfering signals may be transmitted on the same communication channel and are purposely allowed to interfere with one another. The effects of the resulting multi-user interference is then removed at the receiver by a multi-user detector (MUD). Using a MUD does not require a change in the existing transmitted signaling method, making it an attractive option.

To separate multiple interfering signals transmitted on the same communication channel some unique apriori knowledge of each of the signals is required. For this purpose a parameter estimation unit is required, such as disclosed in co-pending U.S. patent application Ser. No. 09/943,770, filed Aug. 31, 2001, entitled "System For Parameter Estimation And Tracking Of Interfering Digitally Modulated Signals". The parameter estimation required to attain this apriori knowledge may be done using "blind" parameter estimation, "non-blind" parameter estimation, or parameter estimation with the aid of training sequences. This last method is typically derived using a "training signal" or other knowledge of received signals in a manner well known in the art. The purpose of the parameter estimation unit is to identify and determine parameters associated with each signal that may later be used by the multi-user detector (MUD) to separate each signal from the other interfering signals, regardless of the fact that the signals exist in the same communications bandwidth and at the same instant in time. These parameters might include the received power, the phase of the oscillator which generated each received signal, the timing offset relative to the base station clock, carrier frequency, any frequency offset of the carrier (phase difference), the assigned spreading code, and the structure of multi-path replicas.

To successfully demodulate simultaneously occurring interfering signals, signal processing of the received signals is accomplished utilizing multiuser detection (MUD) techniques. Early work in MUD, described in *Multiuser Detection* by S. Verdu, Cambridge University Press, 1998 proposed using computationally intense maximum likelihood (ML) exhaustive search techniques to separate the interfering signals. In certain applications, linear MUD detectors with lower computational demands may be used, and such MUD detectors are described by Verdu. However, the reduction in performance, particularly in high-interference situations, is so significant as to make those reduced complexity techniques not applicable. One method of implementing a ML is the well-known decoder known as the Viterbi decoder. A Viterbi decoder is based upon the Viterbi algorithm and performs a breadth first decoding search of all paths through an entire code tree (or trellis, which is a more compact representation of the code tree) by extending paths through the tree and the entire tree is searched. The complexity of the maximum likelihood (ML) Viterbi decoder in the context of many applications is prohibitively high.

The M-algorithm is a tree-pruning technique that approximates the operation of a ML Viterbi decoder at reduced complexity. The M-algorithm is a breadth first decoding algorithm, but with the M algorithm only the best M paths are retained at each level in the tree. This reduced tree search, referred to as "tree pruning", reduces the number of calculations that must be made and therefore speeds the overall tree processing. The M-algorithm is described in greater detail further in the specification.

Viterbi algorithm decoders and M algorithm decoders are also well known in the art as maximum likelihood decoders which can be used in systems that employ error correcting codes, such as convolutional codes tree codes, and a variety of other codes, all of which can be generally characterized by a tree. The basic concept of these decoders can be described as correlating all possible transmitted sequences with the received sequence and then choosing as the "best" or "maximum likelihood" path the sequence whose correlation is a maximum.

A tree consists of a sequence of concatenations of a so-called tree diagram, or state transition diagram. The tree diagram defines, for each code state, which next state or states the encoder is allowed to transition to. The allowable transitions from one state to a next state are limited. Each possible transition from one state to a next state in a tree is called a branch. Each branch, therefore, corresponds to a subset. A sequence of signal points selected from a sequence of interconnected branches is called a path through the tree.

Transmitted signal points are displaced in signal space due to noise and channel-induced distortion, and a receiver may use a Viterbi algorithm decoder or an M algorithm decoder, operating on a received version of the transmitted signal points, to perform the aforementioned maximum likelihood sequence detection or an approximation of ML sequence detection, respectively. Based on the received version of the transmitted signal points and the knowledge of the tree code used by the encoder, the decoder determines the most likely sequence of signal points that was actually transmitted. The decoder performs this function by forming a decision as to what was the most likely transmitted signal point that would have caused the encoder to transition into a next state of the code. The technique works on concepts that can be modeled as a tree code. In the case of interfering signals, a tree can be formed that represents all possible choices of the transmitted values for all signals. That is, error correction coding is not necessarily assumed for tree decoding and doesn't necessarily dictate the formation of the tree. Rather, the tree is formed by the fact that different hypotheses for the received sequences are possible.

More particularly, a Viterbi algorithm decoder, an M algorithm decoder, or any other tree-search decoder forms paths through a tree by keeping track of so-called "metrics". A branch metric, a function of the received version of the signal point, is calculated for each current-to-next-state transition associated with each branch in the tree diagram. Every path through the tree which leads into a state has an associated path metric which is a function of the sum of the branch metrics for the branches that make up that particular path. Further, a path entering a current state may be extended through the tree and enter a next state by including a branch representing an allowed transition from the current state to the next state. The path metric for such an extended path is a function of the sum of (a) the path metric associated with the path as it entered the current state and (b) the branch metric associated with the included branch.

The Viterbi decoder compares the path metrics of the different paths entering a state and retains as one of the aforementioned surviving paths the path with the smallest path metric. All other paths entering that state are discarded. The surviving paths are used by the decoder to make a final decision as to the value of an earlier transmitted signal point.

To reduce the complexity of the tree search, thereby increasing the speed of testing multiple hypotheses, shortcuts may be deliberately taken in the processing with a tree decoder. For instance, the M-algorithm prunes the tree by retaining, at every stage in the tree, the best M paths through the tree at each level in the tree. The computational complexity of a tree search is directly related to the number of hypotheses which must be tested, i.e. the number of paths through the tree which must be examined. For example, for an ML multi-user detector for which there are K interfering signals and which uses the Viterbi algorithm, the computational complexity is on the order of $2^K$ for each symbol interval. For the M-algorithm, the complexity is on the order of $K^{1.2}$ for each symbol interval. The reduction in complexity by using the M-algorithm is considerable, but not for very large values of K or for high data rates. In addition, tree pruning carries with it the risk that the correct path through the tree is eliminated from consideration, which causes a decoding error. Judicious pruning is required. For the M-algorithm, as M is decreased, the complexity is reduced but the probability of incorrect pruning increases. That is, the need for accuracy limits the reduction in complexity that is feasible. The M-algorithm is described in greater detail further in the Summary of the Invention. See also U.S. Pat. No. 6,151,370 issued Nov. 21, 2000 which describes the M-algorithm. Tree pruning techniques also apply to maximum a posteriori (MAP) decoders.

The process used to decode turbo codes, known as the "turbo principal," may be used as an alternative to ML decoding in systems other than turbo coded systems. Because the turbo principal is used in the multi-user detector (referred to as TurboMUD) described in this invention even though it does not employ turbo codes, turbo decoding is now described in the context of turbo codes. However, turbo decoding, or the turbo principal, may be used whenever the system chain up to the receiver contains either serial or parallel concatenated components that mathematically resemble codes. Turbo codes are forward error control codes that are generated using recursive systematic encoders operating on different permutations of the same code information bits to improve the performance of a transmission channel. Turbo decoding involves an iterative algorithm in which probability estimates of the code information bits that are derived by one decoder for the coded information bits being processed in that decoder are fed back to the other decoder as a priori information that can be used in processing by that decoder. Each iteration of decoding of the code information bits through the two decoders generally increases the reliability of the probability estimates. This iterative feedback and decoding process continues, decoding the code information bits a finite number of times, and a decision is made based on the final probability estimates that the bits represent the transmitted data and can be used to make reliable decoding decisions. The turbo decoder operates on one block of coded data bits, or symbols, at a time, passing the revised estimates between the component decoders until processing of that block is complete. One complete pass through both component decoders in the turbo decoder by a block of coded bits is referred to as a decoding iteration; a typical number of iterations required for adequate bit error performance is three to eight.

An arrangement for performing a termination checking procedure, preferably performed after each iteration of decoding, is to determine if a minimal absolute probability value associated with any of the bits in the packet has been reached. Such an arrangement is taught in U.S. Pat. No. 6,182,261. When the minimal absolute probability value is above a predetermined threshold, indicating that all of the bits have been assigned either the value "1" or "0" with relatively high probability, the iterative turbo decoding process is terminated. An alternative to this termination checking procedure is to perform a pre-determined number of iterations for each block of information.

More particularly, with iterative turbo decoding, rather than determining immediately whether received code information bits are either a zero or one, the receiver assigns each code information bit a value on a multi-level scale representative of the probability that the bit is one. A common scale, referred to as log-likelihood ratio (LLR) values, represents each bit by an integer in an implementation-specific range, for instance in the range (−32, +31). For this example integer range, the value of +31 signifies that the transmitted bit was a zero with very high probability, and the value of −32 signifies that the transmitted bit was a one, with very high probability. An LLR value of zero indicates that the bit value is indeterminate. Stated another way, those bits which have a probability indicating that they are closer to one (for example, between 0 and +31 on the scale described above) are tentatively assigned a value of zero, and the rest of the bits (between −32 and 0) are tentatively assigned a value of one. Furthering the example, an LLR value of +31 means that the transmitted bit value is zero with a probability of 31/62+0.5=1, and the probability that the transmitted bit value is one is 0.5−31/62=0. An LLR probability of 16 means that the probability of bit value zero is approximately 0.75 and the probability of bit value one is approximately 0.25. When a probability is equal to 0.5, it means that either bit value (zero or one) is equally likely. The probabilities then, and the corresponding LLR values, indicate the confidence with which the decoder is making the bit decision.

Data represented on the multi-level scale described in the previous paragraph is referred to as "soft data," and the iterative decoding performed is usually soft-in/soft-out, i.e., the decoding process receives a sequence of inputs corresponding to probabilities for the code information bit values and provides as output corrected probabilities taking into account constraints of the code information bits. Generally, a decoder which performs iterative decoding, uses soft data from former iterations to decode the soft data read by the receiver. A method of iterative decoding is described, for example, in U.S. Pat. No. 5,563,897.

The turbo principal as described above is a powerful alternative to ML or MAP decoders but, in general is extremely computationally intensive. The component decoders contained within the turbo decoder, may employ shortcut techniques that reduce the complexity. The component decoders themselves typically contain ML or MAP tree search algorithms such as Viterbi decoders, M-algorithm decoders or other tree search algorithms. The decreased incremental performance of each component that comes as a cost of reduced incremental (i.e. per-iteration) complexity is compensated by iterating. The component decoders contained within the turbo-decoder exploit different relationships between the signals, allowing for performance gains as the number of iterations increases. That is, an iterative decoder using the turbo principal produces improved overall performance when compared to a non-iterative reduced complexity tree search algorithm of similar complexity. However, processing the interfering signals multiple times, i.e. iterating, to maintain the performance level as measured by bit error rates mitigates the complexity reduction gains achieved by shortcuts within the component decoders of the turboMUD. A tradeoff of complexity versus performance and complexity versus processing speed remains.

To further improve the performance of a communication system, some coding schemes include interleavers at the transmitter, which mix up the order of the bits in each packet of bits during encoding. Thus, when interference destroys a few adjacent bits during transmission, the effect of the interference is spread out over the entire original packet and can more readily be overcome by the decoding process. Other improvements may include multiple-component codes which include coding the packet more than once in parallel or in series. However, as this invention is concerned with operation at the receiver, the interleavers included in the receiver are only the interleavers and de-interleavers that are necessary to reverse the operation of any interleaving done at the transmitter.

In short, despite all the decoding processing gains in the art there is still a need for an improved method and apparatus for signal processing simultaneously occurring, interfering signals to speed the decoding processing and allow for acceptable detection performance at realtime operational speeds.

SUMMARY OF THE INVENTION

The present invention provides an improved method and apparatus for processing simultaneously occurring, interfering signals preferably using a turboMUD detector that contains component tree decoders by improving tree construction and the tree pruning to reduce signal processing time to a minimum.

When a decoding tree is constructed in a multi-user decoder at the signal receiver, one level of the tree is defined for each of the co-channel, interfering signals, as is known in the prior art. In accordance with the teaching of the preferred embodiment of the present invention a new set of randomly ordered indices are assigned to the users before a decoding tree is constructed in the multi-user decoder for each symbol interval in the data block for every iteration of decoding performed by the MUD. The random shuffling of the order of the user indices permits all users to occasionally share in the benefit of being placed near the root of the decision tree in the multiuser detector. This re-ordering also improves the likelihood that the pruning is correct for the users near the root of the decision tree for that symbol interval.

DESCRIPTION OF THE DRAWING

The invention will be better understood upon reading the following Detailed Description in conjunction with the drawing in which:

FIG. 4 shows an equation representing the M-algorithm with randomly selected users for the terms in the algorithm.

DETAILED DESCRIPTION

Figure 1:
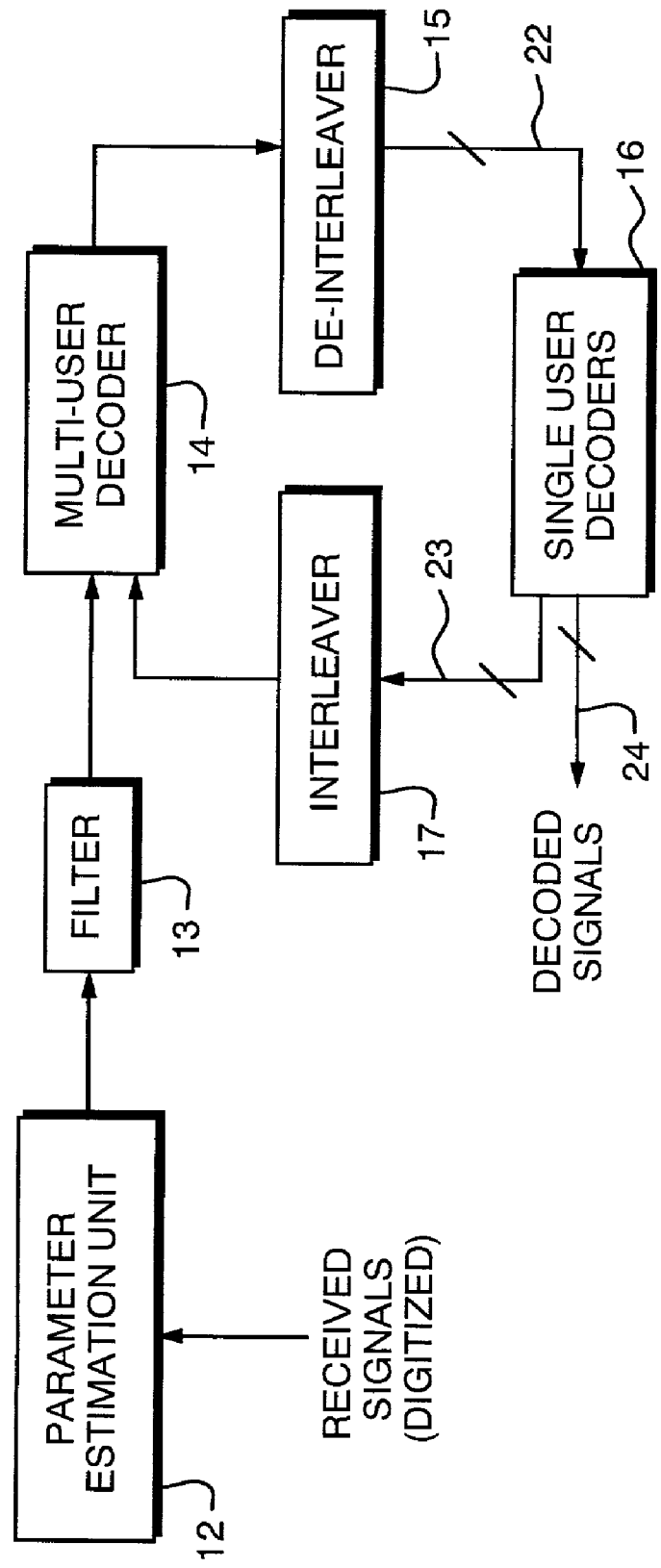
FIG. 1 is a simplified block diagram of a portion of a prior art receiver circuitry utilizing iterative turbo decoding to separate multiple interfering signals on the same communication channel.

In FIG. 1 is shown a simplified block diagram of a portion of a prior art receiver circuitry utilizing iterative turbo decoding to separate multiple interfering signals on the same communication channel. It shows an implementation of a prior art turbo multi-user detector (turboMUD) used to incorporate turbo decoding techniques into MUD with forward error correction (FEC) decoding.

The operation of this prior art, turbo multi-user detector (turboMUD) assumes knowledge of various parameters about received signals such as relative received timing offsets, carrier phase, frequency offsets, received amplitudes, and multi-path structure for each of the interfering signals present in the received signal. A parameter estimation unit 12 is therefore needed. In a turboMUD system decoding, probability estimate and channel symbol estimate information is repeatedly passed between a multi-user decoder (MUD) 14 and a plurality of single-user decoders 16. Soft output decoders, such as maximum a posteriori (MAP) decoders or approximations of MAP decoders, or soft output Viterbi algorithm (SOVA) decoders are preferably used for both the MUD 14 and single user decoders 16 so that soft output information is available from them as is known in the prior art. The MUD 14 unit uses relationships between interfering signals to correct errors within a block of received data due to multi-user interference. The plurality of single user decoders 16 uses the coding relation imposed on each user at the transmitter by an error correction encoder to exploit relations within the sequence of symbols transmitted by each individual user to correct for received symbol errors. Together, MUD 14 and the single user decoders 16 work in concert to estimate the transmitted sequence of symbols from all users within a time frame, also called a block, that is under consideration.

A digitized signal passes through conventional receiver circuitry (not shown) and is then input to parameter estimation unit 12 which utilizes unique apriori knowledge of each of the received signals to help identify parameters for each interfering signal, regardless of the fact that the signals exist in the same communications bandwidth and at the same instant in time. These parameters include the received power, the phase of the oscillator which generated each received signal, the timing offset relative to the base station clock, carrier frequency, any frequency offset of the carrier (phase difference), and the structure of multi-path replicas. This knowledge is typically derived using a parameter estimator in a manner well known in the art, such as the training signal method disclosed in the above identified patent application entitled "System For Parameter Estimation And Tracking Of Interfering Digitally Modulated Signals". However, it is not assumed that training sequences are employed for the MUD receiver to operate correctly.

The digitized signal is then passed through a whitening matched filter 13, of a type known in the art, which serves to cancel some inter-symbol (ISI) interference or which reduces the correlation between symbols of interfering users. An example of such a whitening matched filter is described in detail in U.S. Pat. No. 6,167,022.

The whitened signal is input to multi-user decoder (MUD) 14. In the optimal case, MUD 14 is a full-complexity MAP detector. Suboptimal reduced complexity MAP approaches for MUD detector 14 may be used in an effort to achieve real-time performance. MUD 14 is preferably any tree-based decoder, such as an M-algorithm based tree decoder of a type described in the Background of the Invention. The output from MUD 14 are typically soft signal symbol estimates called "channel symbol estimates" in this description.

If the received signals had been interleaved at the transmitter, the signals output from MUD 14 are first passed through a de-interleaver 15 and passed on in a shuffled, de-interleaved form over lines 22 to a bank of single user decoders 16 in a manner well known on the art. Although interleaving and de-interleaving are mentioned with reference to FIG. 1 for completeness, they are not mentioned with reference to FIGS. 2 and 3 since they are well known in the art.

After being re-ordered by de-interleaver unit 15 the symbol estimates output from MUD 14 are input to a plurality of single-user decoders 16, with there being one single-user decoder used for each signal to be decoded, that decodes all symbols/bits in a particular signal. The single user decoders 16 calculate conditional probabilities called "probability estimates" in this specification, one for each decoded symbol of each user, and output them on line 23.

The single user decoders 16 are soft-output decoders, such as MAP decoders, soft-output Viterbi algorithm (SOVA) decoders, or soft-output M-algorithm-based decoders, which are all well-known in the art. There is a "probability estimate" associated with each data bit in each signal.

Since there is only a single user associated with each of decoders 16 it is feasible to use a full-complexity MAP decoder, SOVA decoder, or other soft-output decoder for each single user decoder 16 to look at all hypotheses in the tree, not just the most likely hypotheses. The single-user decoders 16 each calculate "probability estimates" from their respective input signals and output them for use by MUD 14 which uses them as apriori information during the next iteration of MAP decoding by MUD 14.

Interleaving of the signals output from single user decoders 16 on leads 23 is performed at interleaver 17 to restore the received signals to their original received order. The probability estimates calculated by decoders 16 for each signal are therefore passed in interleaved form to and used by MUD 14 as apriori information when processing the signal a second and subsequent time in the iterative turbo processing.

The passing of information between MUD 14 and the single-user decoders 16 is repeated a predefined number of times, or until a desired bit error rate performance is attained, or until further iterations result in insignificant changes in the channel symbol estimates. At that point, the estimates of the decoded signals (i.e. estimates of the data sequences) are output from the single user decoders 16 over path 28.

The operation then re-commences using the next block of received data bits, repeating the process described above. The above described operation is possible in real time only if the processing for the computations done for all of the iterations for each block of data sequences is completed before the next data symbol sequences are received. In general, for a large number of interfering users, real time processing with acceptable bit error rate performance is not possible for the prior art system just described.

Figure 2:
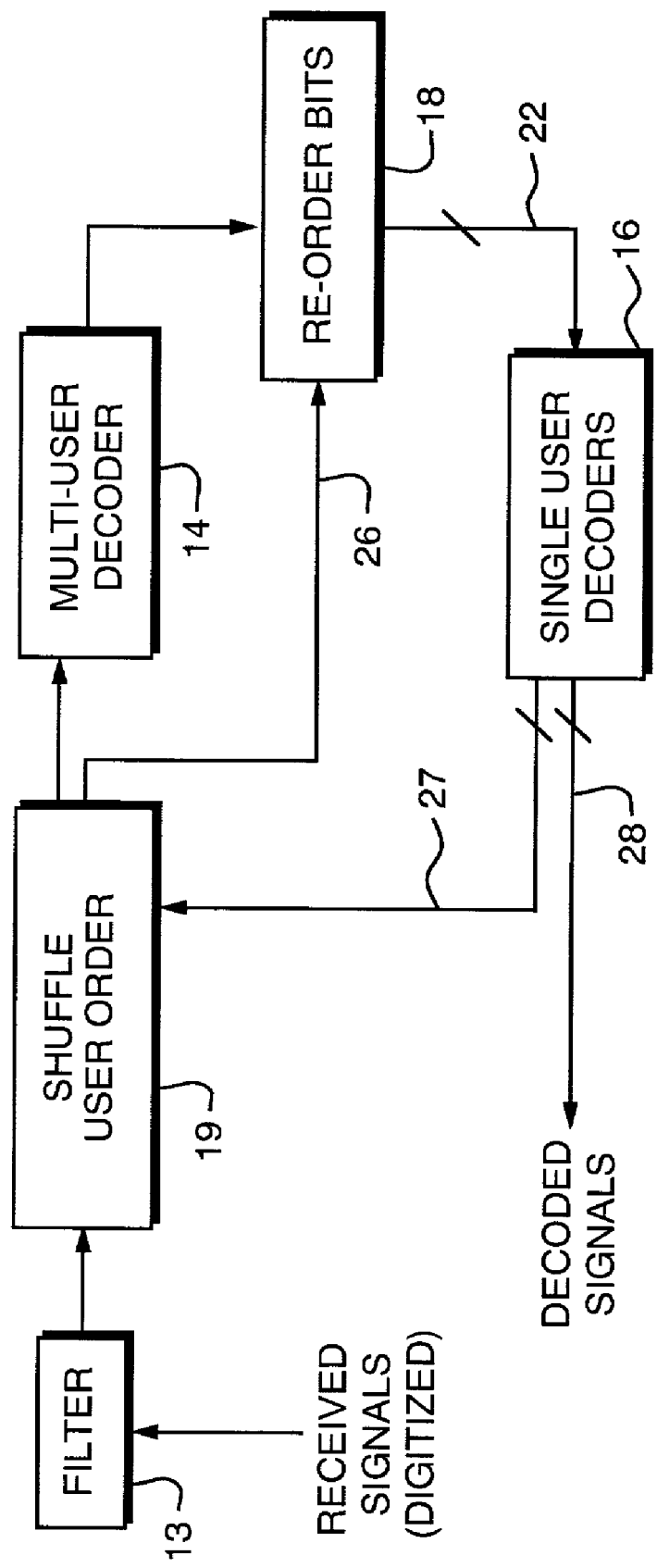
FIG. 2 is a simplified block diagram that features the teaching of the invention by implementing turbo decoding with the addition of random ordering of user indices in the levels of a decoding tree for each symbol interval in every iteration of decoding.

FIG. 2 shows a simplified block diagram of a portion of prior art receiver circuitry implementing turbo decoding with the addition of randomly ordering the indices of active users by shuffle user order block 19 for each block of received data bits output from whitening filter 13 for decoding processing, in accordance with the teaching of the present invention. The random shuffling of the order of the user indices permits all users to occasionally share in the benefit of initially being placed near the root of the decision tree in multi-user detector (MUD) 14. The randomly assigned order is changed for every symbol interval within the data block. The benefit is that when a user signal is assigned to the root of the decision tree in MUD 14 it improves the likelihood that the pruning is correct for that user for that symbol interval. For a simple example, if there are three active users their normal signal indices may be represented as (A,B&C). Shuffle user order block 19 randomly changes these signal indices for each symbol interval to say B,A,C, then C,A,B, then C,B,A and so forth as each symbol interval is input to MUD 14 for the entire data block and for every iteration.

After each block of randomly ordered signal data is initially input to MUD 14 for processing, iterative decoding is performed by MUD 14 and single user decoders 16 during which the signal indices used to assign users to each level of the decoding tree of MUD decoder 14 for each decoding iteration are randomly assigned. It can be seen that FIG. 2 is somewhat similar to FIG. 1 except for units 18 and 19 and paths 26 and 27 which are used to implement the present invention. In addition, the decoders in MUD 14 and single user decoders 16 may be either hard or soft-output decoders.

If interleaving is applied to the data sequences at the transmitters, de-interleaving and interleaving units would be added to the block diagram in FIG. 2. For simplicity, FIG. 2 considers the case for which interleaving is not present at the transmitters. It is important to note that shuffle user order unit 19 and re-order bits unit 18 in FIG. 2 are not replacements for interleaver 17 and de-interleaver 15 in FIG. 1. Rather, they are used to implement the invention in addition to any interleaving/de-interleaving necessitated by the format of the transmitted signal sequences.

In FIG. 2 the purpose of whitening filter 13 is the same as described with reference to FIG. 1. The whitening filter 13 operates on received signals containing more users than dimensions in overloaded environments and serves to cancel some inter-symbol (ISI) interference or to reduce the correlation between symbols of interfering users. Thus, parameter estimation is implied, although not shown in FIG. 2. Parameter estimation is known in the art and is generally described in the Background of the Invention.

The whitened, digitized signal output from filter 13 is input to shuffle user order unit 19 that initially randomly orders the indices of active users for each symbol interval within the block of received data bits. The randomly reordered signals output from unit 19 are input to multi-user detector (MUD) 14. In the optimal case, the MUD detector is a full-complexity MAP detector. Sub-optimal reduced complexity MAP or ML approaches for MUD detector 14 may be used in an effort to achieve real-time performance. MUD 14 is preferably any tree decoder such as the M-algorithm tree decoder of a type as described in the Background of the Invention.

The output from multi-user decoder (MUD) 14 may be either hard or soft estimates of the signal symbols and are called "channel symbol estimates" in this description. When soft estimates are calculated they are also known as reliability measures, confidence measures and by other names. Using hard estimates reduces computational complexity, at a cost of degraded performance level. However, in this embodiment, either type of estimate (soft or hard) is possible.

The novel difference in operation of MUD 14 in FIG. 2 from the prior art is that the decoding tree that is initially constructed therein is responsive to shuffle user order unit 19 which, for each iteration of decoding, randomly orders the received signals for each symbol interval within each block of data symbols. The random shuffling of the order of the user signals for each symbol interval permits all users to occasionally share in the benefit of initially being placed near the root of the decision tree in multi-user detector (MUD) 14. Maintaining the index order for an entire block of symbols and then randomly re-ordering at the start of the next iteration of decoding is an obvious degenerate case of re-ordering at every symbol interval, as is re-ordering at any other less frequent interval. However, in this description, it will be assumed that re-ordering occurs on a per-symbol-interval basis.

To accomplish this, shuffle user order unit 19 and re-order bits unit 18 are new. Unit 19 is used to control how MUD 14 constructs its decoding tree for every symbol interval in every iteration of symbol decoding, and re-order bits unit 18 receives the ordering information from unit 19 via path 26 and restores the ordering of the processed signal symbols to their original positions following each iteration of processing through MUD 14. The restoration of order is necessary so that the single user decoders receive information in the order imposed by the forward error correction encoder in the transmitters, i.e. so each single user decoder operates only on the signal it is designed to decode.

After being re-ordered by unit 18, as described above, the channel symbol estimates of information signal symbols calculated by MUD 14 are input to each of a plurality of single-user decoders 16, with there being one single-user decoder 16 used for each signal to be decoded, and each decoder 16 decodes all symbols in a particular signal for the time frame corresponding to the received sequence under observation. If the single user decoders 16 are soft-output decoders, they calculate conditional probabilities called "probabilities estimates" in this specification, one for each decoded symbol of each user, and output them as probability estimates on line 27. The probability estimates are also known as reliability measures, confidence measures and by other names. Soft-output decoders, such as MAP decoders, soft-output Viterbi algorithm (SOVA) decoders, or soft-output M-algorithm-based decoders, are all well-known in the art. If the single user decoders 16 are hard-output decoders, they calculate hard estimates of the symbols and output them as estimates on line 27. Hard estimates can be considered a special, restricted case of soft estimates, in which only two possible values (0 or 1) of probability estimates are possible. Hard-output decoders, such as Viterbi decoding, hard output M-algorithm, or T-algorithm decoders, are well-known in the art. The use of the estimates by unit 19 and MUD 14 are described above.

At the completion of the first iteration of processing of the signals through single user decoders 16 the individual signal bits then have probability estimates ranging between 0 and 1.0 that are forwarded to shuffle user order unit 19 via lead 27. Shuffle user order unit 19 again randomly assigns signal indices for each symbol interval. The re-ordered estimates are sent over path 25 to MUD 14, so that within MUD unit 14 the signal with the lowest index is assigned to the root of the decoding tree, the signal with the second lowest index is assigned to the next lowest level of the tree, and so on, for each symbol interval.

Since there is only a single user associated with each of decoders 16 it is feasible to use a full-complexity ML or MAP decoder, SOVA decoder, or other hard or soft-output decoder in each single user decoder contained in unit 16 to look at all hypotheses in the tree, not just the most likely hypotheses. The single-user decoders 16 each calculate a probability estimate for their respective signal and outputs it on lead 27 to shuffle user order unit 19 which provides ordering information over lead 25 for use by MUD 14 in constructing its decoding tree for the next iteration of decoding and as apriori information during the next iteration of MAP decoding by MUD 14.

The passing of information between MUD 14 and the single-user decoders 16 is repeated a predefined number of times, or until the desired bit error rate performance is attained, or until further iterations will result in insignificant changes in the probability estimates output from single user decoders 16 and therefore will not significantly improve the turboMUD bit error rate performance. At that point, the estimates of the decoded signals (i.e. estimates of the data sequences) are output from the single user decoders 16 over path 28. The above described operation is then repeated for the next block of received data bits.

The process of differently ordering the decoding tree in MUD14 allows the pruning done in the tree decoder within MUD 14 to be done more correctly, or with fewer hypotheses examined, which reduces the overall complexity of the turboMUD detector and allows for real-time operation.

Because the random shuffling does not rely on confidence values to determine the ordering, the single user decoders can be lower complexity hard-output decoders, or if improved performance is desired, soft-output decoders.

Figure 3:
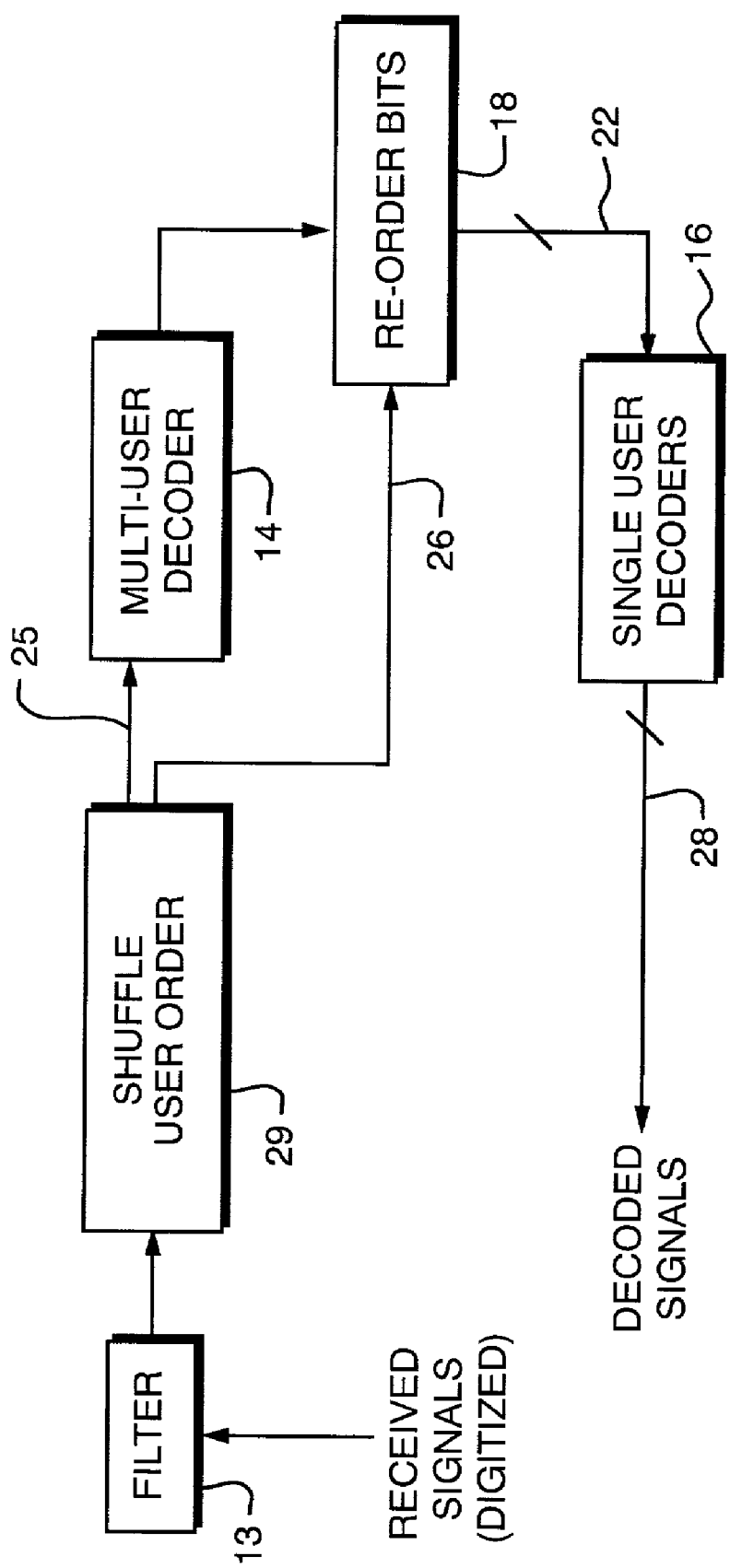
FIG. 3 is a simplified block diagram that features the teaching of the invention by implementing a degenerate case of an iterative approach in which only one decoding pass is made through the multi-user decoder for each block of data.

In FIG. 3 is shown an alternative embodiment of the invention which is a degenerate case of an iterative approach in which only one decoding pass is made through the multi-user decoder 14 and the single user decoders 16 for each block of data. Its operation is the same as that described for FIG. 2 except that there are no multiple iterations of decoding. Only a brief description of the elements in FIG. 3 is given here for simplicity and ease of understanding and more details may be found in the description of FIG. 2.

The received, digitized signal is passed through a whitening matched filter 13, of a type known in the art, which serves to cancel some inter-symbol (ISI) interference or which reduces the correlation between symbols of interfering users. The signal is then input to shuffle user order unit 29 which randomly ordering the indices of active users for each symbol interval of each block of received data symbols. The randomly re-ordered information is passed over lead 25 to MUD 14 which sets up its decoding tree responsive thereto. The random shuffling of the order of the user indices permits all users to occasionally share in the benefit of initially being placed near the root of the decision tree in multi-user detector (MUD) 14. The benefit is that when a user signal is assigned to the root of the decision tree in MUD 14 it improves the likelihood that the pruning is correct for that user for that symbol interval. For a simple example, if there are three active users their normal signal indices may be represented as (A,B&C). Shuffle user order block 19 randomly changes these signal indices for each symbol interval to say B,A,C, then C,A,B, then C,B,A and so forth as the symbols are input to MUD 14.

Each block of randomly ordered signal data is initially input to MUD 14 for processing, as described with reference to FIG. 2. Decoding is performed by MUD 14 and the signals are output to re-order bits unit 18. As MUD 14 constructs its decoding tree, the ordering information from shuffle user order block 19 is passed over lead 26 to re-order bits unit 18 which uses it to restore the ordering of the processed signal symbols to their original positions as received from filter 13. The restoration of order is necessary so that the single user decoders 16 receive information in the order imposed by the forward error correction encoder in the transmitters.

The re-ordered bits are input to each of a plurality of single-user decoders 16, with there being one single-user decoder 16 used for each signal to be decoded. Each decoder 16 decodes all symbols/bits in a particular signal and estimates of the data sequences are output from the single user decoders 16 over path 28. Since there is only a single user associated with each of decoders 16 it is feasible to use a full-complexity ML or MAP decoder or other hard or soft output decoder for each single user decoder 16 to look at all hypotheses in the tree, not just the most likely hypotheses.

The decoding operation described above is then repeated using the next block of received data symbols. No further iterations on the processed symbols are done. The above described operation is possible in real time only if the processing for the computations done for all of the iterations for each block of data sequences is completed before the next data symbol sequences are received.

In FIG. 4 is shown the mathematical expression of an M-algorithm. The term explanations indicate that a first user is randomly selected by unit 19 and assigned to the first term of the algorithm for the depicted symbol interval of a block of data, a second user is randomly selected by unit 19 and assigned to the second term of the algorithm for the symbol interval depicted, and so on, with the random ordering changed for each symbol interval, at each iteration and for each new block of data being processed.

In the M-algorithm Omega represents the real-valued metric value calculated for a complete path through a tree using the equation; $b_1$, $b_2$ etc. are the binary values of a transmitted data symbols of each individual signal in the co-channel, interfering signals and are either a +1 or −1, and both values (+1 and −1) are tried in the equation in each symbol hypothesis to determine the lowest metric value; $R_{11}$, $R_{12}$ etc., are entries in the correlation matrix formed by the signature vectors of all the interfering users over the time frame associated with the data sequences of interest; and $y_1$, $y_2$ etc. are vector space representations of the outputs of the whitening matched filter for all received interfering signals. Each term on the right-hand side of the equation represents a node of the decoding tree and all of the possible hypotheses branching from that node.

As previously described, prior art decoders calculate the metrics of many complete paths through a tree between the tree root and each terminating node or leaf of the tree. The path through a tree having the "best" metric value defines the nodes and thereby the value of the "b" terms (+1 or −1) for each individual signal bit comprising the co-channel, interfering signal. Depending on the mathematical representation used for the metric in the tree construction, the path with either the largest or the smallest metric is chosen as the most likely path. The choice of relying on the smallest metric or largest metric is based on which choice produces the highest probability of being correct. The variations associated with these implementation details are well known in the art. While the use of tree pruning algorithms reduces the computational complexity required to determine a "best" path through the decoding tree, their complexity improvement is limited due to bit error rate performance constraints. That is, pruning can eliminate the correct path from considering within the decoder, causing a decoding error and degrading the overall performance while speeding the processing speed. The tradeoff between processing speed and overall bit error performance is a delicate one that prior art has not resolved to the point of allowing for real time processing for a large number of interfering signals at reasonable bit error rates.

In accordance with the teaching of the preferred embodiment of the invention shown in FIG. 2, for each symbol interval a first user is randomly selected by unit 19 and assigned to the first term of the algorithm for the decoding of data, a second user is randomly selected by unit 19 and assigned to the second term of the algorithm for the symbol interval, and so on, with the random ordering being changed for each symbol interval of data being processed for the data block. In this way, the number of paths examined in the decoding tree of MUD 14 from root to leaf is reduced without increasing the likelihood of improperly pruning the true best path through the decoder. Thus, the decoding process is greatly speeded up without affecting overall error performance. All of the interfering users share in the benefit of occasionally being placed near the root of the decoding tree, so that the performance level of the users is not widely varying due simply to a fixed placement in index order. In other words, due to the novel probability estimate ordering in the decoding tree, a low complexity suboptimal search of the tree will be less likely to chop off branches containing the correct answer, thus supplying the correct decoding answer more often than when probability estimate ordering is not used.

While what has been described herein is the preferred embodiment of the invention it should be obvious to those skilled in the art that the teaching of the present invention may be applied to any field in which tree decoding is utilized, and the invention may be modified without departing from the spirit and scope of the invention.

What is claimed is:

1. A method for improving the ability to demodulate purposely overlapping digitally encoded signals from multiple users operating on the same frequency at the same time using the same code, comprising the steps of a) decoding blocks of data of received, overlapping signals from multiple users using a multi-user decoding system that performs multiple iterations of decoding of each data block of the signals to identify the value of signal points, the multi-user decoding system including a multi-user decoder and a plurality of single user decoders, the multi-user decoder using an algorithm defining a tree diagram having a number of node levels equal to the number of signals from which the signal points are derived, with the first/highest order term of the algorithm being assigned to the first/root node level of the tree, the second/next highest term of the algorithm being assigned to second node level of the tree, and so on;
 b) randomly assigning a random user priority order to the received, overlapping signals using signal indices, the overlapping signals represented in a block of data being decoded by the multi-user decoding system to the node levels of the tree for each symbol interval for a first iteration of decoding in steps (c) and (d);
 c) performing a first decoding of the block of data in the multi-user decoder to determine first channel symbol estimates for each of the signals;
 d) performing a first decoding of the block of data in the single user decoders, with each signal in the block of data being assigned to and processed by a single user decoder, and using the first channel symbol estimates determined in step (c) for each signal in an assigned one of the single user decoders to determine a first probability estimate for each of the data bits in the signals;
 e) performing a second decoding of the block of data in the multi-user decoder using the first probability estimate determined in step (d) for each of the signals after randomly re-assigning the signal indices to differently order the users, thus to determine a revised channel symbol estimate for each of the signal points of the signals;
 f) performing a second decoding of the block of data in the single user decoders, with each signal being assigned to and processed by a single user decoder, and using the revised channel symbol estimates determined in step (e) for each signal in the assigned one of the single user decoders to determine a revised probability estimate of the data bits for each of the signals, the decoding in steps (e) and (f) accomplishing a second iteration of decoding;
 g) repeating steps (e) and (f) for third and subsequent iterations of decoding, with channel symbol estimates for each iteration of decoding determined in step (e) being used by the single user decoders in step (f), and revised data bit probability estimates for each iteration of decoding determined in step (f) being used is step (e); and
 h) decoding the signals in the block of data using the value of signal points determined as a result of the iterative decoding steps (a)–(g), whereby the random user priority ordering is done on each pass through the multi-user detector so that no one user is consistently given a low priority.

2. The method in accordance with claim 1 wherein the iterative decoding performed by the multi-user and single user decoders on each block of data is repeated until there are insignificant changes in the probability estimates for each signal processed by the single-user decoders.

3. The method in accordance with claim 1 wherein the iterative decoding performed by the multi-user and single user decoders on each block of data is repeated a predetermined number of times before the signals are decoded.

4. The method in accordance with claim 1 further comprising the step of re-ordering the bits output from the multi-user decoder to match the original order of the received, interfering signal bits.

5. The method in accordance with claim 4 further comprising the step of ordering the signal bits output from the single-user decoders before they are re-input to the multi-user decoder, into an order randomly determined, to determine new channel symbol estimates for each of the signals.

6. The method in accordance with claim 5 wherein the iterative decoding by the multi-user and single user decoders on each block of data is repeated until there are insignificant changes in the data bit probability estimates for each signal obtained by the single-user decoders.

7. The method in accordance with claim 5 wherein the iterative decoding by the multi-user and single user decoders on each block of data is repeated a predetermined number of times before the signals are decoded.

8. Apparatus for improving the ability to demodulate purposely overlapping digitally encoded signals from multiple users operating on the same frequency at the same time using the same code, comprising:

a multi-user detection system for decoding blocks of data of received, overlapping signals from multiple users that performs multiple iterations of decoding on each block of data of the signals to identify the value of signal points, said multi-user detection system including a multi-user decoder and a plurality of single user decoders, said multi-user decoder using an algorithm defining a tree diagram having a number of node levels equal to the number of signals from which the signal points are derived, with the first/highest order term of the algorithm being assigned to the first/root node level of the tree, the second/next highest term of the algorithm being assigned to second node level of the tree, and so on;
 a user priority shuffler for randomly assigning a random user priority order to the received, overlapping signals represented in each symbol interval within a block of data being decoded by said multi-user detection system to the node levels of the tree for a first iteration of decoding;
 said multi-user decoder performing a first decoding of the block of data to determine a first estimate for each of the signal points of the signals; and,
 said plurality of single user decoders each performing a first decoding on one of the signals using the first channel symbol estimate determined by the multi-user decoder for each signal to determine a first data bit probability estimate for each signal;
 wherein said multi-user decoder performs in a second pass a second decoding of the signals using a randomly re-calculated order to assign the signals to the node levels of the tree to determine a revised set of channel symbol estimates for the signals;

wherein the plurality of said single user decoders each perform a second decoding on one of the signals using the revised channel symbol estimates determined by said multi-user decoder for each signal to determine second probability estimate for each data bit in each signal;

wherein decoding is repeatedly performed by said multi-user decoder and said single user decoders for third and subsequent decoding of the signals represented in the block of data with a random ordering method being used to assign the signal to each term of the algorithm, to determine subsequent channel symbol estimate for each of the signals; and, wherein the signals are decoded using the value of signal points determined as a result of the decoding steps performed by said multi-user and single user decoders, whereby the random user priority ordering is done on each pass through said multi-user detector so that no one user is consistently given a low priority.

9. The invention in accordance with claim 8 wherein the iterative decoding by the multi-user and single user decoders on each block of data is repeated until there are insignificant changes in the data bit probability estimates for each signal processed by the single-user decoders.

10. The invention in accordance with claim 8 wherein the iterative decoding by the multi-user and single user decoders on each block of data is repeated a predetermined number of times before the signals are decoded.

11. The invention in accordance with claim 8 further comprising means for re-ordering the bits output from the multi-user decoder to match the original order of the received, interfering signal bits.

12. The invention in accordance with claim 11 further comprising means for ordering the signal bits output from the single-user decoders before they are re-input to the multi-user decoder, into an order randomly determined, to determine a revised channel symbol estimate for each of the signals processed by the multi-user decoder.

13. The invention in accordance with claim 12 wherein the iterative decoding by the multi-user and single user decoders on each block of data is repeated until there are insignificant changes in the data bit probability estimates for each signal processed by the single-user decoders.

14. The invention in accordance with claim 12 wherein the iterative decoding by the multi-user and single user decoders on each block of data is repeated a predetermined number of times before the signals are decoded.

15. A computer readable medium for improving the ability to demodulate purposely overlapping digitally encoded signals from multiple users operating on the same frequency at the same time and using the same code, the computer readable medium containing executable instructions for:

a) decoding blocks of data of received, overlapping signals from multiple users using a multi-user decoding system that performs multiple iterations of decoding of each data block of the signals to identify the value of signal points, the multi-user decoding system including a multi-user decoder and a plurality of single user decoders, the multi-user decoder using an algorithm defining a tree diagram having a number of node levels equal to the number of signals from which the signal points are derived, with the first/highest order term of the algorithm being assigned to the first/root node level of the tree, the second/next highest term of the algorithm being assigned to second node level of the tree, and so on;

b) randomly assigning a random user priority order to the received, overlapping signals using signal indices, the overlapping signals represented in a block of data being decoded by the multi-user decoding system to the node levels of the tree for each symbol interval for a first iteration of decoding in steps (c) and (d);

c) performing the first iteration of decoding of the block of data in the multi-user decoder to determine a first channel symbol estimate for each of the signals;

d) performing a first decoding of the block of data in the single user decoders, with each signal in the block of data being assigned to and processed by a single user decoder, and using the first channel symbol estimate determined in step (c) for each signal in an assigned one of the single user decoders to determine a first data bit probability estimate for each of the signals;

e) performing a second decoding of the block of data in the multi-user decoder using the first probability estimate determined in step (d) for each of the signals, after randomly re-assigning the signal indices to differently order the users, thus to determine a second channel symbol estimate for each bit in the signals;

f) performing a second decoding of the block of data in the single user decoders, with each signal being assigned to and processed by a single user decoder, and using the second channel symbol estimate determined in step (e) for each data bit in the signal in the assigned one of the single user decoders to determine a second data bit probability estimate for each of the data bits in the signals, the decoding in steps (e) and (f) accomplishing a second iteration of decoding;

g) repeating steps (e) and (f) for third and subsequent iterations of decoding, with revised channel symbol estimates for each iteration of decoding determined in step (e) being used in step (f), and revised data bit probability estimates for each iteration of decoding determined in step (f) being used is step (e); and (h) decoding the signals in the block of data using the value of signal points determined as a result of the iterative decoding steps (c)–(g), whereby the random user priority ordering is done on each pass through the multi-user detector so that no one user is consistently given a low priority.

16. The computer readable medium in accordance with claim 15 further comprising program instructions for:
re-ordering the bits output from the multi-user decoder to match the original order of the received, interfering signal bits in each block of data being processed; and
ordering the signal bits output from the single-user decoders before they are re-input to the multi-user decoder, into an order randomly determined, to determine revised channel symbol estimates for each of the signals in the multi-user decoder.

17. The computer readable medium in accordance with claim 16 wherein the iterative decoding by the multi-user and single user decoders on each block of data is repeated until there are insignificant changes in the data bit probability estimates for each signal processed by the single-user decoders.

18. The computer readable medium in accordance with claim 16 wherein the iterative decoding by the multi-user and single user decoders on each block of data is repeated a predetermined number of times before the signals are decoded.

* * * * *